United States Patent [19]

Perraudin

[11] Patent Number: 4,656,394

[45] Date of Patent: Apr. 7, 1987

[54] PARTICLE ACCELERATOR WITH FREQUENCY CORRECTION

[75] Inventor: Claude Perraudin, Meudon, France

[73] Assignee: C.G.R. MeV, Buc, France

[21] Appl. No.: 784,560

[22] Filed: Oct. 4, 1985

[30] Foreign Application Priority Data

Oct. 12, 1984 [FR] France .............................. 84 15701

[51] Int. Cl.[4] .......................... H01J 25/10; H03L 7/00

[52] U.S. Cl. .................................. 315/5.41; 315/5.43; 328/233; 331/9; 331/96

[58] Field of Search .................... 315/5.41, 5.44, 5.43; 328/233-238; 331/9, 96

[56] References Cited

U.S. PATENT DOCUMENTS

| | | | |
|---|---|---|---|
| 2,593,463 | 4/1952 | Kinzer | 331/9 |
| 3,820,035 | 6/1974 | Meddaugh | 315/5.41 |
| 3,858,121 | 12/1974 | Kaneko et al. | 331/96 |
| 4,107,617 | 8/1978 | Tran | 315/5.41 |
| 4,121,173 | 10/1978 | Azam et al. | 328/233 |

*Primary Examiner*—Harold Dixon

*Attorney, Agent, or Firm*—Oblon, Fisher, Spivak, McClelland & Maier

[57] ABSTRACT

A particle accelerator with frequency correction is provided in which an electromagnetic wave, supplied by a generator, is injected into a cavity through a wave guide. A frequency corrector device comprises two non directional couplers taking directly from said wave guide a standing wave from which an error signal is elaborated and applied to said generator for correcting the frequency of the electromagnetic wave.

8 Claims, 6 Drawing Figures

FIG_1
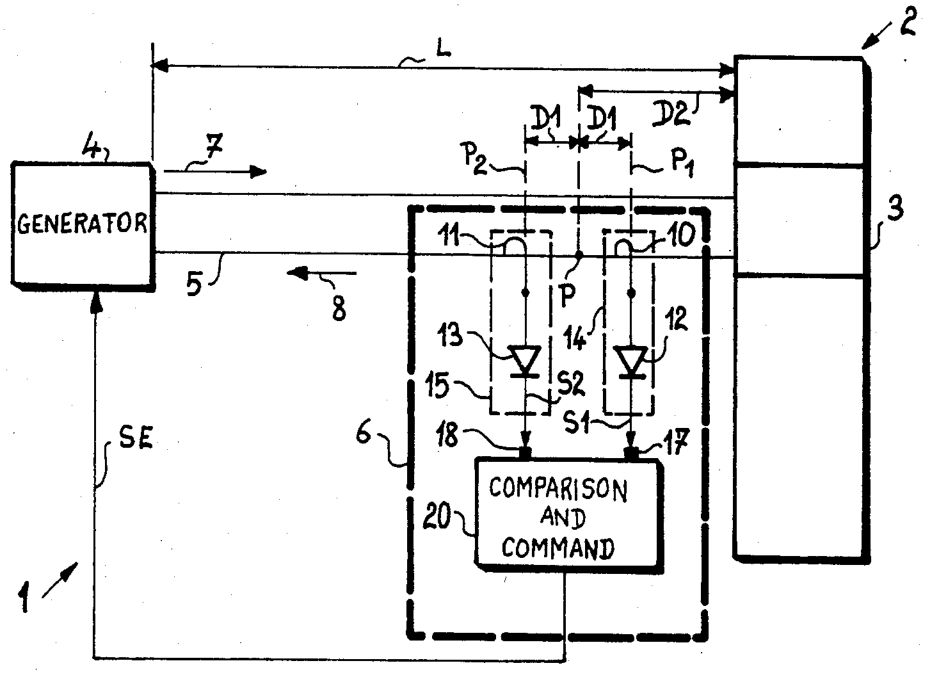
FIG_2-a
FIG_2-b
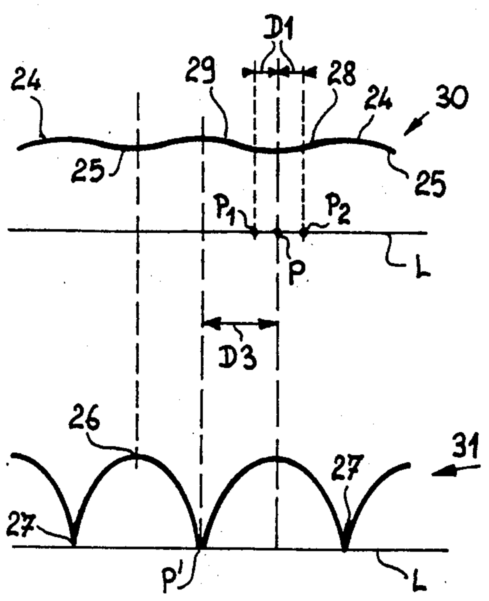

FIG_4
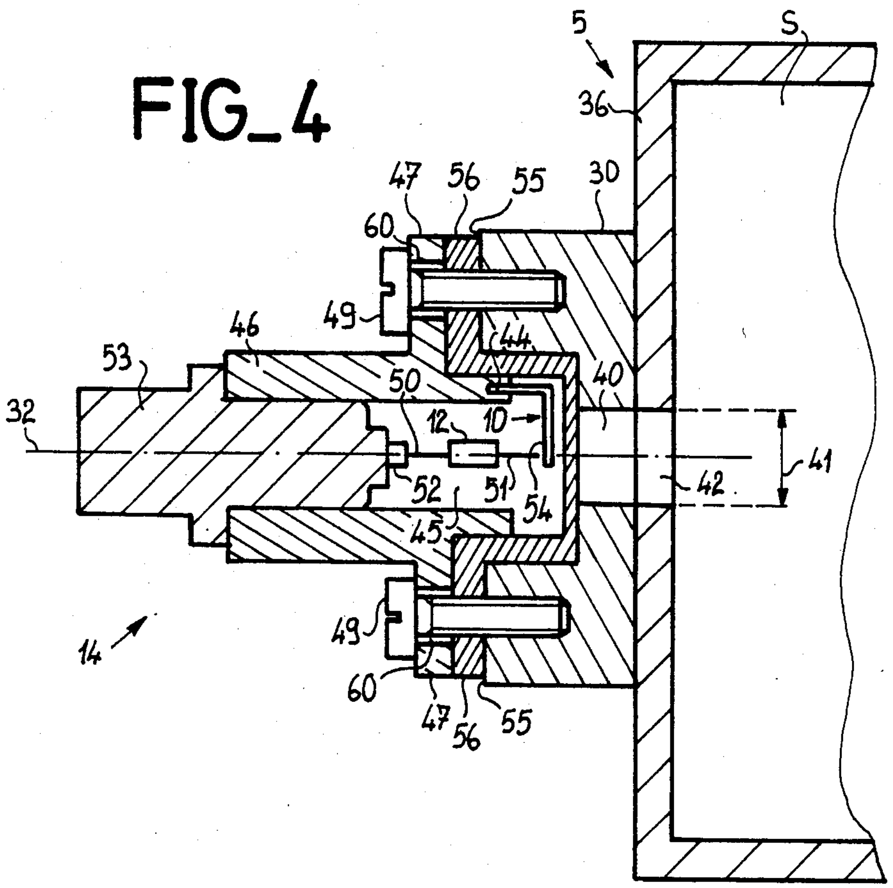
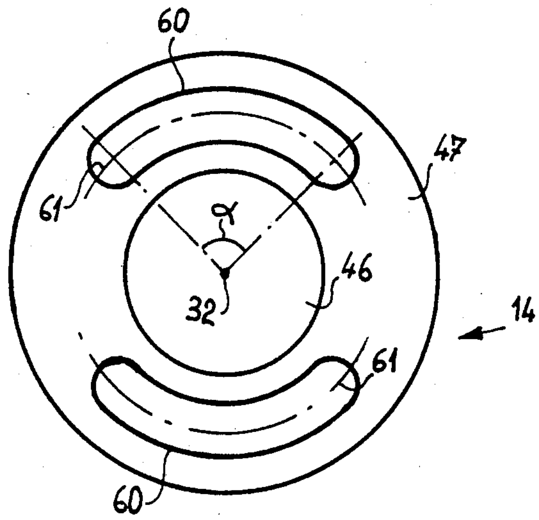
FIG_5

PARTICLE ACCELERATOR WITH FREQUENCY CORRECTION

BACKGROUND OF THE INVENTION

The invention relates to a particle accelerator with frequency correction, of the type in which the particles are accelerated under the effect of an electromagnetic wave injected into a resonant cavity.

In accelerators of this type, it is of prime importance for the frequency of the electromagnetic wave, delivered by an ultra high frequency generator for example, to correspond to a tuning frequency or to the resonance frequency of the resonant cavity, so that a maximum of electromagnetic power is transferred from the generator to the resonant cavity.

The electromagnetic wave is applied to the resonant cavity through a transmission line, generally formed by a wave guide in the case of ultra high frequencies, and a difference between the frequency of the electromagnetic wave and the tuning frequency causes reflection by the cavity of all or part of the incident power. There then exists in the wave guide, an incident wave which is propagated from the generator to the cavity and a reflected wave which is propagated from the cavity to the generator; the phase of the reflected wave varying greatly about the tuning frequency.

These phenomena are used for elaborating an error signal which is applied to the generator so as to correct any frequency deviation; the generator comprising in a way known per se means for modifying the frequency of the wave which it generates.

For this, with the frequency correction devices of the prior art, a first signal relative to the incident wave is taken from the wave guide through a first directional coupler and a second signal relative to the reflected wave is taken through a second directional coupler. These signals are applied to the opposite ends of a second transmission line, of coaxial type, and for one of these signals via an adjustable attenuator means and an adjustable phase shift means.

The superimposition of the incident wave and of the reflected wave generates a standing wave, whose maximums and minimums occupy, along the second line, positions defined by the setting of the adjustable phase shift means the ratio of a maximum to a minimum being determined by the setting of the adjustable attenuator. In addition, two detector means detect the standing wave in the second line, at judiciously spaced points placed at equal distances from a minimum of the wave, so as to obtain two measurement signals having an equal amplitude for the tuning frequency; this being obtained more especially by adjusting the phase shift means. The measurement signals are applied to a conventional type device, which works out the difference thereof and which delivers an error signal having a zero value when the frequency of the electromagnetic wave corresponds to the tuning frequency, or a positive or negative value depending on whether these frequencies are different in one direction or in the other.

The two waves, one direct and the other reflected, must be absorbed after passing through the second transmission line, which requires for each of these waves an absorber element such as an ultra high frequency insulator.

The arrangement of the means which has just been described has been known and used for a long time for controlling the frequency, more especially in particle accelerators. It may be noted, for accelerators for example, that industrial progress has considerably reduced the cost prices, but that up to present this reduction in cost has not concerned the part relative to the frequency control. This high cost is due on the one hand to the high cost of each of its elements, namely the two directional couplers, the two absorber elements, the adjustable attenuator, the variable phase shifter, the second transmission line and on the other hand because of the considerable work required for mounting, assembling and adjusting all these elements.

In fact, the succession of operations required for adjusting such a correction device is long and delicate, more especially in so far as the relative positioning between the detector means and the minimum of the standing wave is concerned.

It should be further noted that the number of these elements adversely affects the reliability of the assembly, and that a defect occuring in a simple adjustable attenuator has serious consequences in the use of a particle accelerator.

SUMMARY OF THE INVENTION

One of the aims of the present invention is to simplify, not only in so far as the number of elements is concerned, but also in their nature and arrangement, the part relative to frequency correction, particularly in a particle accelerator.

The present invention relates to a particle accelerator with frequency correction, allowing the frequency of the electronic wave injected into a resonant cavity to be corrected with an increased accuracy with respect to the prior art, while ensuring a better integration of the means required for accomplishing this function, through a new arrangement which facilitates use thereof.

According to the invention, in a particle accelerator with frequency correction, comprising:

at least one resonant cavity defining a given tuning frequency, an ultra high frequency generator, delivering an incident wave of adjustable frequency, a wave guide by means of which said incident wave is applied to said resonant cavity, a frequency corrector device comprising first and second coupling means connected respectively to a first and to a second diode and further comprising a comparison and control means delivering an error signal for frequency controlling said generator as a function of a difference of amplitude between signals delivered by said diodes, said coupling means are non directional couplers, each taking directly from said wave guide a fraction of a standing wave, and said first and second non directional couplers are disposed along said wave guide, on each side and at the same distance from a point where there exists a minimum of said standing wave when the frequency of the incident wave is equal to said tuning frequency.

BRIEF DESCRIPTION OF THE DRAWINGS

The invention will be better understood from the following description, given by way of non limitative example, with reference to the five accompanying Figures in which:

FIG. 1 shows schematically a particle accelerator in accordance with the invention;

FIGS. 2*a*, 2*b* show field intensity variations in a transmission line in which a standing wave condition has been established;

FIG. 4 shows one embodiment of a characteristic means of the invention in section;

FIG. 5 shows another characteristic means in a front view.

DESCRIPTION OF THE PREFERRED EMBODIMENTS

Figure 3:
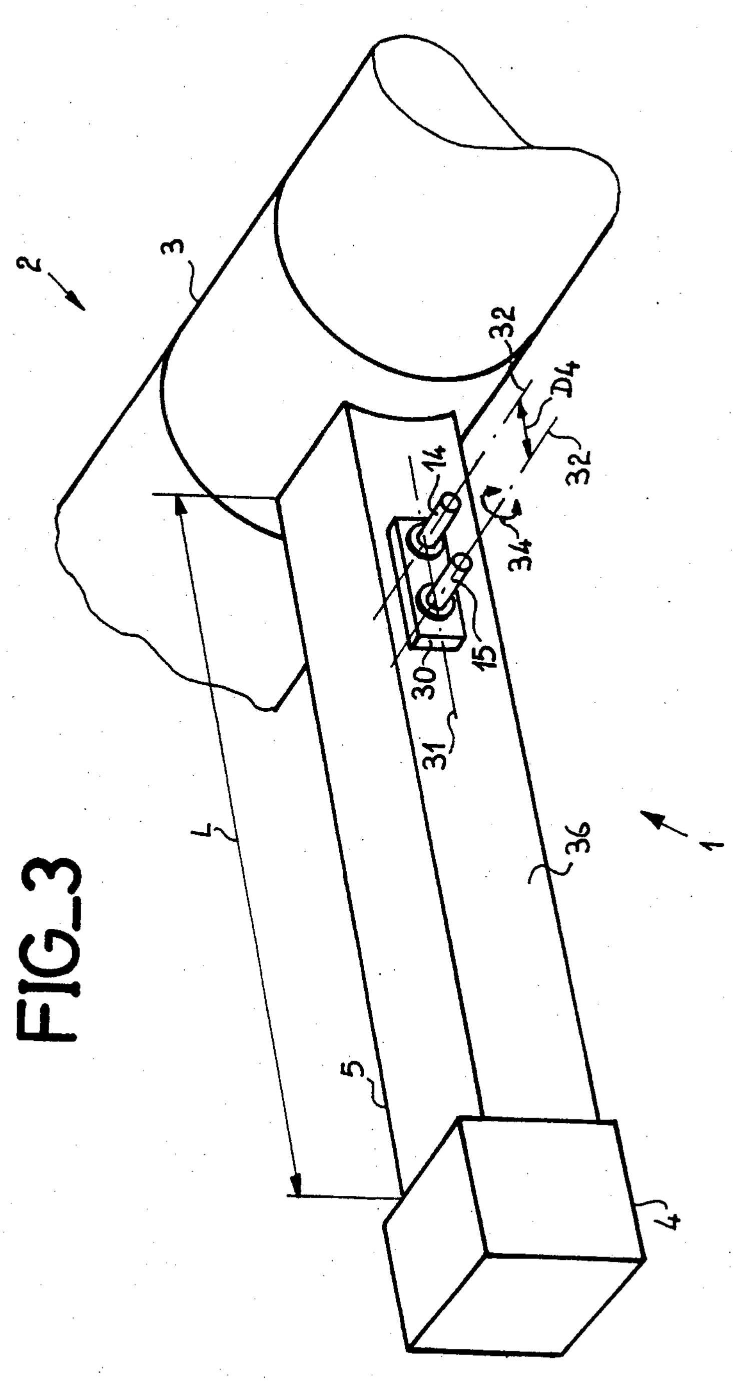
FIG. 3 shows the accelerator of the invention in a perspective view.

FIG. 1 shows schematically a particle accelerator 1 in accordance with the invention. Accelerator 1 comprises, in a way known per se, a structure 2 having at least one resonant cavity 3, in which is injected an electromagnetic wave (not shown) produced by an ultra high frequency generator 4.

Generator 4 is connected to the resonant cavity 3 by a wave guide 5. For a tuning frequency $F_0$ such as the resonance frequency of cavity 3 for example, the generator-wave guide - resonant cavity assembly 3-4-5 is in practice adjusted and the wave, called incident wave, delivered by generator 4, is completely or almost completely injected into the resonant cavity 3, if its frequency $F_1$ corresponds to the tuning frequency $F_0$.

In order to maintain equality between the frequency $F_1$ of the incident wave and the tuning frequency $F_0$, accelerator 1 further comprises a frequency corrector device 6, shown in a broken line frame.

Wave guide 5 fullfils a first known function which consists in transporting the incident wave from the generator 4 to the resonant cavity 3 in the direction of arrow 7. In the accelerator 1 of the invention, it fullfils, with respect to the frequency corrector device 6, a further second function, in which it forms the source of a standing wave (not shown). This standing wave is formed by the incident wave, on which is superimposed a reflected wave (not shown) which is propagated in the resonant cavity 3 towards the generator 4, in the direction of a second arrow 8; since the reflected wave is due to the reflection of the incident wave by the resonant cavity 3, its level is low when the frequency $F_1$ of the incident wave corresponds to the tuning frequency $F_0$ and increases with the difference between these two frequencies, at the same time as its phase varies considerably.

In the invention, it is the standing wave which is directly used by the frequency corrector device 6, which avoids having to use directional couplers as is the case in the prior art.

The frequency corrector device 6 comprises first and second non directional coupling means 10, 11 formed for example by a coupling antenna, each taking from wave guide 5 a fraction of the standing wave; this fraction is proportional to the level which the wave comprises at positions $P_1$, $P_2$, occupied respectively by the first and second non directional couplers 10, 11 along the length L of the wave guide 5.

The first non directional coupler 10 is connected to a first diode 12, with which it is assembled in a first coupler-detector block 14, in accordance with a non limitative embodiment which is explained in greater detail further on in the description.

The second non directional coupler 11 is connected to a second diode 13, with which it is assembled in a second coupler-detector block 15. The first and second diodes 12, 13 are of a conventional high frequency or ultra high frequency type delivering respectively a first and second signal $S_1$, $S_2$ themselves respectively proportional to the level of the wave at positions $P_1$, $P_2$. The signals $S_1$, $S_2$ are applied to the inputs 17, 18 of a comparison and control device 20 which delivers an error signal SE, applied to the generator 4.

The comparison and control device 20, known per se, is intended to work out a difference between the amplitude of the signals $S_1$, $S_2$ delivered by diodes 12, 13, as was explained in the preamble. The comparator device 20 comprises conventional means (not shown) such for example as means for low frequency modulation of the signals $S_1$, $S_2$, followed by detector means, themselves followed by a comparison means such as a conventional differential amplifier. The error signal SE which results from these operations then comprises either a zero value when the two frequencies $F_1$, $F_0$ are equal, or a positive or negative value depending on the direction of their difference.

These conditions are obtained by disposing the first and second coupling means 10, 11 along the wave guide 5, on each side and at the same distance $D_1$ from a point P coinciding with the position of a minimum (not shown in FIG. 1) of the standing wave, when the frequency $F_1$ of the incident wave is equal to the tuning frequency $F_0$; the distance $D_1$ between the coupling means 10, 11 and this point P being, in the non limitative example described, substantially equal to an eighth of the wave length $\lambda°/8$ of frequency $F_0$.

If the frequency $F_1$ of the incident wave is held fixed, by measuring the error signal SE using a conventional measuring means (not shown), the position of a minimum of the standing wave may be detected when the two coupling means 10, 11 are moved simultaneously along the wave guide 5. But, when the two frequencies $F_1$, $F_0$ are equal, reflection of the incident wave by the resonant cavity 3 is low, as is the level of the reflected wave and this minimum is not readily detectable. So, in order to determine the position P of the minimum with respect to which the two non directional coupler means 10, 11 are disposed, i.e. a second distance $D_2$ between point P and cavity 3, the method may consist in causing generator 4 to deliver the incident wave at a frequency $F_1$ different by a known value from the tuning frequency $F_0$, this difference being of the order of 1 MHz for example, when the tuning frequency $F_0$ is of the order of 3000 MHz; much more pronounced minimums of the standing wave thus being able to be obtained.

FIGS. 2*a* and 2*b* should be taken together and they show the difference in distribution of the maximums and minimums which the standing wave comprises along the length L of wave guide 5, depending on whether the frequency $F_1$ of the incident wave is different from or equal to the tuning frequency $F_0$. In FIG. 2*a*, a first curve 30 symbolizes the standing wave and shows the alternation of maximums 24 and minimums 25, which are not very pronounced, defined when the frequency $F_1$ of the incident wave is equal to the tuning frequency $F_0$; one of these minimums 25 coinciding with the above mentioned point P.

A second curve 31 shows alternations of second maximums 26 and second minimums 27, which are very prominent, defined when the frequency $F_1$ of the incident wave is different from the tuning frequency $F_0$ by $\pm 1$ MHz. This difference of the frequencies $F_1$, $F_0$ defines for the phase of the reflected wave a variation of $\pm\pi$(or $\lambda°/2$);

this variation appears since a minimum 25 of the first curve 30 coincides with a maximum 26 of the second curve 31.

Thus, it is sufficient to identify a position P' of a second minimum 27, such as defined when the frequencies $F_1$, $F_0$ are different, for then defining the corresponding position P at the minimum 25 established when the two frequencies $F_1$, $F_0$ are equal; the distance $D_3$ between the positions P, P' being, over the length L of the wave guide 5, substantially equal to a quarter of the wave length $\lambda°/4$ of the tuning frequency $F_0$.

As was mentioned above, the position P' of the second minimum 27 may be defined by moving the two coupler means 10, 11 simultaneously along the length L of the wave guide 5; these coupler means being kept apart from each other by twice the above mentioned distance $D_1$, i.e. substantially $\lambda°/4$, and measuring the error signals SE. But such determination of the position P' of the second minimum 27 may be obtained more readily by using conventional ultra high frequency measurement means, such as a measurement line.

The first and second coupler means 10, 11 are then placed at the positions $P_1$, $P_2$, on each side of the first point P corresponding to the first minimum 25, and at the same distance $D_1$ equal to $\lambda°/8$ therefrom. Each of the coupler means 10, 11 is thus situated on opposite sides 28, 29 of the wave, with respect to the first minimum 25, and are subjected to substantially identical field levels; this balance situation being disturbed, when the frequency $F_1$ of the incident wave becomes different from the tuning frequency $F_0$. It should be noted that the coupler means 10,11 are spaced apart from each other by $\lambda°/4$, but that they may also be subjected to substantially identical field levels if they are spaced apart by a multiple of $\lambda°/4$.

In the accelerator 1 of the invention, the non directional couplers 10, 11 are formed by coupling antennae, mounted so as to be orientatable, as is explained in greater detail hereafter in the description; this orientation of couplers 10, 11, or of only one of them, further allows the amplitude of the signals $S_1$, $S_2$ delivered by diodes 12, 13 to be equalized if required when the two frequencies $F_1$, $F_0$ are equal. The error signal SE then has a zero amplitude, and any deviation between the frequencies $F_1$, $F_0$ causes a positive or negative variation of this error signal SE.

FIG. 3 shows the accelerator 1 of the invention in a perspective view, in which structure 2 is partially represented; the wave guide 5 being disposed, depending on length L between the generator 4 and cavity 3.

The first and second coupler-detector blocks 14, 15 containing respectively the first non directional coupler 10, the first diode 12 and the second non directional coupler 11, the second diode 13 (not shown in FIG. 3), are fixed to a wall 36 of wave guide 5. In the non limitative example described, the coupler-detector blocks 14, 15 are fixed to the wave guide 5 through a support 30 common to these two blocks 14, 15; a longitudinal axis 31 of support 30 being parallel to the length L of wave guide 5. The advantage of this arrangement is that it allows the distance $D_4$ to be defined by construction equal to $\lambda°/4$ between axes of symmetry 32 which each coupler-detector block 14, 15 comprises; support 30 comprising two housings (not shown in FIG. 3) in which the coupler-detector blocks 14, 15 are embedded.

In the example described, the coupler-detector blocks 14, 15 are disposed so that the axes of symmetry 32 are substantially parallel to each other and perpendicular to the length L of the wave guide 5.

The coupler-detector blocks are fixed to support 30 so that they may rotate, as shown by the third arrow 34, about their axis of symmetry in order to achieve the above mentioned orientation of the non directional couplers 10, 11; the coupling rate being determined by the dimensions of coupling holes (not shown in FIG. 3) formed in the wall 36 of wave guide 5 and in support 30.

FIG. 4 shows by way of non limitative example, in a sectional view, one embodiment of the coupler-detector block 14 mounted on the wave guide 5; this description being also valid for the other coupler-detector block 15.

The wave guide 5 is partially shown in FIG. 4, through its section S, its length L (not visible) being perpendicular to the plane of the Figure.

Support 30 is fixed by conventional means (not shown) to the wall 36 of wave guide 5 and comprises a first coupling hole 40 having substantially the same diameter 41 as a second coupling hole 42 formed in wall 36 opposite the first hole 40; these coupling holes 40, 42 being centered on the axis of symmetry 32.

Support 30 comprises, opposite the coupling holes 40, 42 a central recess 45 forming one of the above mentioned housings in which the first block 14 is housed; support 30 comprises, in a plane perpendicular to the plane of the Figure, a second recess 45 (not visible in the Figure) for receiving the second coupler-detector block 15; these recesses forming means for positioning the coupler-detector blocks 14, 15.

The coupler-detector block 14 comprises a body 46 containing the non directional coupler 10 and diode 12 disposed substantially along the axis of symmetry 32. Diode 12 is connected electrically by one end 50 to a terminal 52 of a connector 53 of a coaxial type for example; the other end 51 of diode 12, is connected to the non directional coupler 10; this latter being formed by a coupling antenna 54, formed in the example described by a copper wire whose end 44 opposite diode 12 is connected to the body 46 of block 14.

Block 14 comprises, about body 46, a fixing collar 47 by which it is fixed to support 30, by means of screws 49 for example. Block 14 is fixed to one face 55 of support 30 via a seal 56 which extends into the central recess 45 whose form it assumes and which it closes opposite the coupling holes 40, 42; this seal 56 provides sealing for the wave guide 5 and it must be formed, opposite the coupling holes 40, 42; from a material permeable to the electromagnetic radiation.

A non directional coupler 10, 11 or coupling antenna 54 and a diode 12, 13 thus form a self contained coupler-detector block 14, 15 which facilitates the industrial manufacture thereof and simplifies mounting and possible replacement on the wave guide 5.

In the non limitative example described, rotation of the coupler-detector block 14, about its axis of symmetry 32, is provided through the form of openings 60 made in the fixing collar 47 for passing screws 49 therethrough. These openings, in a plane perpendicular to that of FIG. 3, extend along an arc of a circle which has the axis of symmetry 32 as center, as shown in FIG. 5.

FIG. 5 shows the coupler-detector block 14 in a front view. The central part is formed by the body 46 and the peripheral part by the fixing collar 47.

Collar 47 comprises openings 60, in the shape of a bean, disposed along an arc of a circle 61 which has the axis of symmetry 32 as center; openings 60 extend through an angle $\alpha$ of about 90°.

Openings 60 thus form a particularly simple means for orientating a coupler-detector block 14, 15 and the coupling antenna 54 which this latter comprises, which avoids using an adjustable attenuator device, as is the case in the prior art.

This description of the accelerator 1 of the invention shows the considerable simplification with respect to the prior art, brought by the invention in the part relative to the frequency correction; this simplification concerning both the number of elements used and the nature and arrangement thereof.

What is claimed is:

1. In a particle accelerator with frequency correction, comprising:

at least one resonant cavity defining a given tuning frequency, an ultra high frequency generator delivering an incident wave of adjustable frequency, a wave guide, by means of which said incident wave is applied to said resonant cavity, a frequency corrector device comprising a first and second coupling means connected respectively to a first and to a second diode and further comprising a comparison and control means delivering an error signal for frequency controlling said generator as a function of an amplitude difference between the signals delivered by said diodes, said coupling means are non directional couplers each taking directly from said wave guide a fraction of a standing wave and said first and second non directional couplers are disposed along said wave guide, on each side thereof and at the same distance from a point where there exists a minimum of said standing wave when the frequency of the incident wave is equal to said tuning frequency.

2. The accelerator as claimed in claim 1, wherein said distance between each of said non directional coupling means and said minimum of the standing wave is substantially equal to an eighth of the wave length of said tuning frequency, or to a multiple of this eighth of a wave length.

3. The accelerator as claimed in claim 1, wherein said non directional coupling means are formed by coupling antennae.

4. The accelerator as claimed in claim 3, wherein at least one coupling antenna is orientatable, so as to allow the amplitudes of the signals delivered by said diodes to be equalized.

5. The accelerator as claimed in claim 1, wherein a non directional coupler and a diode form a self contained coupler-detector block.

6. The accelerator as claimed in claim 5, wherein the two coupler-detector blocks are fixed to the wave guide by means of the same support and said support comprises means for positioning the two coupler-detector blocks at a given distance from each other.

7. The accelerator as claimed in claim 5, wherein the means for positioning the two blocks are formed by recesses in which said blocks are housed.

8. The accelerator as claimed in claim 5, wherein a coupler-detector block comprises means allowing it to rotate about its axis of symmetry.

* * * * *